(12) United States Patent
Jeunink et al.

(10) Patent No.: US 10,571,814 B2
(45) Date of Patent: Feb. 25, 2020

(54) LITHOGRAPHIC METHOD

(71) Applicant: ASML NETHERLANDS B.V., Veldhoven (NL)

(72) Inventors: Andre Bernardus Jeunink, Bergeijk (NL); Laurentius Johannes Adrianus Van Bokhoven, Veldhoven (NL); Stan Henricus Van Der Meulen, Helmond (NL); Yang-Shan Huang, Veldhoven (NL); Federico La Torre, Eindhoven (NL); Bearrach Moest, Eindhoven (NL); Stefan Carolus Jacobus Antonius Keij, Breda (NL); Enno Van Den Brink, Eindhoven (NL); Christine Henriette Schouten, Veldhoven (NL); Hoite Pieter Theodoor Tolsma, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/318,191

(22) PCT Filed: Jun. 29, 2017

(86) PCT No.: PCT/EP2017/066087
§ 371 (c)(1),
(2) Date: Jan. 16, 2019

(87) PCT Pub. No.: WO2018/015121
PCT Pub. Date: Jan. 25, 2018

(65) Prior Publication Data
US 2019/0235392 A1    Aug. 1, 2019

(30) Foreign Application Priority Data

Jul. 21, 2016 (EP) .................................. 16180548

(51) Int. Cl.
G03F 7/20 (2006.01)
G03F 1/62 (2012.01)
G03F 1/64 (2012.01)

(52) U.S. Cl.
CPC .............. *G03F 7/7085* (2013.01); *G03F 1/62* (2013.01); *G03F 1/64* (2013.01); *G03F 7/70308* (2013.01);
(Continued)

(58) Field of Classification Search
CPC .......... G03F 1/62; G03F 1/64; G03F 7/70308; G03F 7/7085; G03F 7/70866; G03F 7/70908; G03F 7/70916; G03F 7/70983
(Continued)

(56) References Cited

U.S. PATENT DOCUMENTS

2002/0057422 A1    5/2002    Arakawa
2004/0255676 A1    12/2004   Hibbs
(Continued)

FOREIGN PATENT DOCUMENTS

JP    H04130711    5/1992
JP    2002049145   2/2002
(Continued)

OTHER PUBLICATIONS

International Search Report and Written Opinion issued in corresponding PCT Patent Application No. PCT/EP2017/066087, dated Sep. 28, 2017.
(Continued)

*Primary Examiner* — Colin W Kreutzer
(74) *Attorney, Agent, or Firm* — Pillsbury Winthrop Shaw Pittman LLP

(57) ABSTRACT

A lithographic apparatus has a support structure constructed to support a patterning device and associated pellicle, the patterning device being capable of imparting the radiation
(Continued)

beam with a pattern in its cross-section to form a patterned radiation beam, and a projection system configured to project the patterned radiation beam onto a target portion of a substrate, wherein the support structure is located in a housing and wherein pressure sensors are located in the housing.

11 Claims, 6 Drawing Sheets

(52) U.S. Cl.
CPC ...... *G03F 7/70866* (2013.01); *G03F 7/70983* (2013.01)

(58) Field of Classification Search
USPC .............................. 355/30, 53, 75, 77; 430/5
See application file for complete search history.

(56) References Cited

U.S. PATENT DOCUMENTS

| | | |
|---|---|---|
| 2005/0140949 A1 | 6/2005 | Jasper et al. |
| 2009/0244501 A1 | 10/2009 | Anderson et al. |
| 2013/0335722 A1 | 12/2013 | Aangenent et al. |
| 2015/0241796 A1 | 8/2015 | Ebert, Jr. et al. |
| 2015/0316854 A1 | 11/2015 | Gruner et al. |
| 2016/0313637 A1 | 10/2016 | Jansen et al. |

FOREIGN PATENT DOCUMENTS

| | | |
|---|---|---|
| JP | 2002151400 | 5/2002 |
| JP | 2002158153 | 5/2002 |
| JP | 2004296829 | 10/2004 |
| JP | 2004343102 | 12/2004 |
| JP | 2006060037 | 3/2006 |
| JP | 2013536573 | 9/2013 |
| JP | 2015536476 | 12/2015 |
| JP | 2016539372 | 12/2016 |
| KR | 20110060358 | 6/2011 |
| WO | 2016169727 | 10/2016 |

OTHER PUBLICATIONS

"Optical Behavior of Pellicles", Tutor59d.doc: Version Aug. 14, 2007, The Lithography Expert, Nov. 2007.
Japanese Office Action issued in corresponding Japanese Patent Application No. 2018-567931, dated Dec. 18, 2019.

LITHOGRAPHIC METHOD

CROSS-REFERENCE TO RELATED APPLICATIONS

This application is the U.S. national phase entry of PCT patent application no. PCT/EP2017/066087, which was filed on Jun. 29, 2017, which claims the benefit of priority of European patent application no. 16180548.6, which was filed on Jul. 21, 2016, and which are incorporated herein its entirety by reference.

FIELD

The present invention relates to a lithographic method, and also to a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a mask, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

It is conventional in DUV lithographic apparatus to attach a pellicle to the mask. The pellicle is a transmissive film which is spaced a few mm (e.g. 5 mm.) away from the pattern of the mask. A contamination particle which is received on the pellicle is in the far field with respect to the pattern of the mask, and consequently does not have a significant impact upon the quality of image which is projected by the lithographic apparatus on to a substrate. If the pellicle were not present then the contamination particle would lie on the pattern of the mask and would obscure a portion of the pattern thereby preventing the pattern from being projected correctly on to the substrate. The pellicle thus plays an important role in preventing contamination particle from adversely affecting the projection of a pattern on to a substrate by the lithographic apparatus.

Although the pellicle provides a useful and valuable function, the pellicle causes an undesirable side effect in that it will itself have an effect upon the image which is projected by the lithographic apparatus on to the substrate. This is because the pellicle has a finite thickness and a refractive index which is greater than air, and thus will cause some deflection of any radiation which is not perpendicularly incident upon the pellicle.

It is desirable to provide, for example, a method which obviates, or mitigates, one or more problems of the prior art, whether identified herein or elsewhere.

SUMMARY

According to a first aspect of the invention there is provided a lithographic apparatus comprising a support structure constructed to support a patterning device and associated pellicle, the patterning device being capable of imparting the radiation beam with a pattern in its cross-section to form a patterned radiation beam, and a projection system configured to project the patterned radiation beam onto a target portion of a substrate, wherein the support structure is located in a housing and wherein pressure sensors are located in the housing.

The pressure sensors allow pressure variations in the environment between the projection system and the pellicle to be measured during the scanning movement, and thereby allow deformation of the pellicle during that movement to be determined. Thus, the pressure variations can be used as input for a model which provides an accurate determination of deformation of the pellicle, and this can in turn be used to determine the adjustments which compensate for the pellicle deformation.

The pressure sensors may be provided either side of an opening in the housing, the opening being between the pellicle and the projection system.

A plurality of pressure sensors may be provided on each side of the opening in a scanning direction of the lithographic apparatus.

A series of pressure sensors may be provided.

The series of pressure sensors may be arranged as a one dimensional array which extends in the scanning direction.

The lithographic apparatus may further comprise a controller configured to apply adjustments to the lenses of the projection system during the scanning exposure to compensate for aberrations due to deformation of the pellicle caused by pressure variations in the environment between the projection system and the pellicle during scanning movement of the mask and pellicle.

The controller may use a pressure model which models pressure variations of gas in the environment between the projection system and the pellicle during the scanning movement of the mask and pellicle. The pressure model may be calibrated for that lithographic apparatus using pressure measurements obtained from the pressure sensors during scanning movement of the mask and pellicle.

According to a second aspect of the invention there is provided a sensing system assembly comprising a two-dimensional array of pressure sensors supported by a support structure and further comprising a pellicle frame and a pellicle, wherein the two-dimensional array of pressure sensors is located between the support structure and the pellicle and configured to measure pressure changes caused by movements of the pellicle, wherein the support structure is not a conventional mask, and wherein the sensing system assembly has outer dimensions which correspond with outer dimensions of a mask assembly comprising a conventional mask, pellicle frame and pellicle.

The sensing system assembly is advantageous because it can be loaded into a lithographic apparatus and caused to undergo scanning movements in the same way as a conventional mask assembly. Whilst undergoing these scanning movements the sensing assembly is able to record pressure measurements which can be used to calculate deflection of the pellicle that occurs during the scanning movements.

The sensing system assembly may measure around 150 mm by around 150 mm. The sensing system assembly may measure 152 mm by 152 mm.

The sensing system assembly may have a thickness of around 6 mm.

The sensing system assembly may further comprise electronics, the electronics including at least one of a memory, a processor and a transmitter.

According to a third aspect of the invention there is provided a method of measuring pellicle deflection in a lithographic apparatus, the method comprising loading a mask assembly comprising a mask and pellicle into the lithographic apparatus of the first aspect of the invention, performing scanning movements of the mask assembly and obtaining pressure measurements using the pressure sensors, and calculating deflections of the mask assembly pellicle that occur during the scanning movements.

According to a fourth aspect of the invention there is provided a method of measuring pellicle deflection in a lithographic apparatus, the method comprising loading a sensing system assembly according to the second aspect of the invention into the lithographic apparatus, performing scanning movements of the sensing system assembly and obtaining pressure measurements using the sensing system assembly, and calculating deflections of the sensing system assembly pellicle that occur during the scanning movements.

The deflections of the sensing system assembly pellicle may be calculated using acoustic holography.

The pressure measurements may be stored in a memory in the sensing system assembly.

Pressure measurements may be transmitted from the sensing system assembly whilst the sensing system assembly is located within the lithographic apparatus.

According to a fifth aspect of the invention there is provided a method of performing a scanning exposure of a target portion of a substrate using a lithographic apparatus, the method comprising loading a mask assembly comprising a mask and pellicle into the lithographic apparatus, passing a radiation beam through the mask and through the pellicle during scanning movement of the mask and the associated pellicle and during scanning movement of the substrate, using a projection system of the lithographic apparatus to project the radiation beam onto the target portion of the substrate, and applying adjustments to the lenses of the projection system during the scanning exposure to compensate for aberrations due to deformation of the pellicle. The deformation of the pellicle may have been measured using a method according to the third aspect or the fourth aspect of the invention.

According to a sixth aspect of the invention there is provided a computer program comprising computer readable instructions configured to cause a computer to carry out a method according to any of the third, fourth or fifth aspects of the invention.

According to a seventh aspect of the invention there is provided a computer comprising a memory storing processor readable instructions, and a processor arranged to read and execute instructions stored in said memory, wherein said processor readable instructions comprise instructions arranged to control the computer to carry out a method according to of the third, fourth or fifth aspects of the invention.

According to an aspect of the invention there is provided a method of performing a scanning exposure of a target portion of a substrate using a lithographic apparatus, the method comprising providing the lithographic apparatus with a mask and associated pellicle, passing a radiation beam through the mask and through the pellicle during scanning movement of the mask and associated pellicle and scanning movement of the substrate, using a projection system of the lithographic apparatus to project the radiation beam onto the target portion of the substrate, and applying adjustments to the lenses of the projection system during the scanning exposure, wherein the adjustments take into account pressure variations in an environment between the projection system and the pellicle caused by scanning movement of the mask and pellicle, and wherein the adjustments compensate for aberrations due to deformation of the pellicle caused by the pressure variations.

The method may use a pressure model which models the pressure of gas in the environment between the projection system and the pellicle during the scanning movement of the mask and pellicle.

The pressure model may be calibrated for that lithographic apparatus using pressure measurements obtained from pressure sensors during scanning movement of the mask and pellicle. This advantageously allows the pressure model to be calibrated to take into account the geometry of an environment in which the mask and pellicle are located (there may be some variation between geometries due to tolerances in the construction of the lithographic apparatus).

The pressure sensors may be provided either side of an opening in a housing which contains the mask and pellicle.

A plurality of pressure sensors may be provided on each side of the opening in the scanning direction.

The pressure model may be calibrated using pressure measurements obtained during scanning movement of the mask and pellicle before the scanning exposure of the target portion. This takes advantage of the fact that deformation of the pellicle is consistent for scanning movements of the same length and same speed.

The pressure model may be calibrated during set-up of the lithographic apparatus before production substrates are exposed by the lithographic apparatus.

The pressure model may be calibrated using pressure measurements obtained during scanning exposure of a preceding substrate.

The pressure model may be calibrated using pressure measurements obtained during scanning exposure of a preceding target portion.

The method may further comprise using a pellicle deformation model to determine deformation of the pellicle caused by the pressure variations.

The pellicle deformation model may be calibrated using a property of the pellicle.

The property of the pellicle may be tension of the pellicle.

The method may further comprise using a radiation beam aberration model which models the effect of the pellicle deformation upon the radiation beam projected onto the substrate, and using a lens model to determine adjustments which are applied to the lenses.

The radiation beam aberration model may receive as an input an illumination mode of the radiation beam used during the scanning exposure.

The aberrations which are compensated for may comprise distortions in an image plane of an image projected by the lithographic apparatus.

Features of one aspect of the invention may be combined with features of a different aspect of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
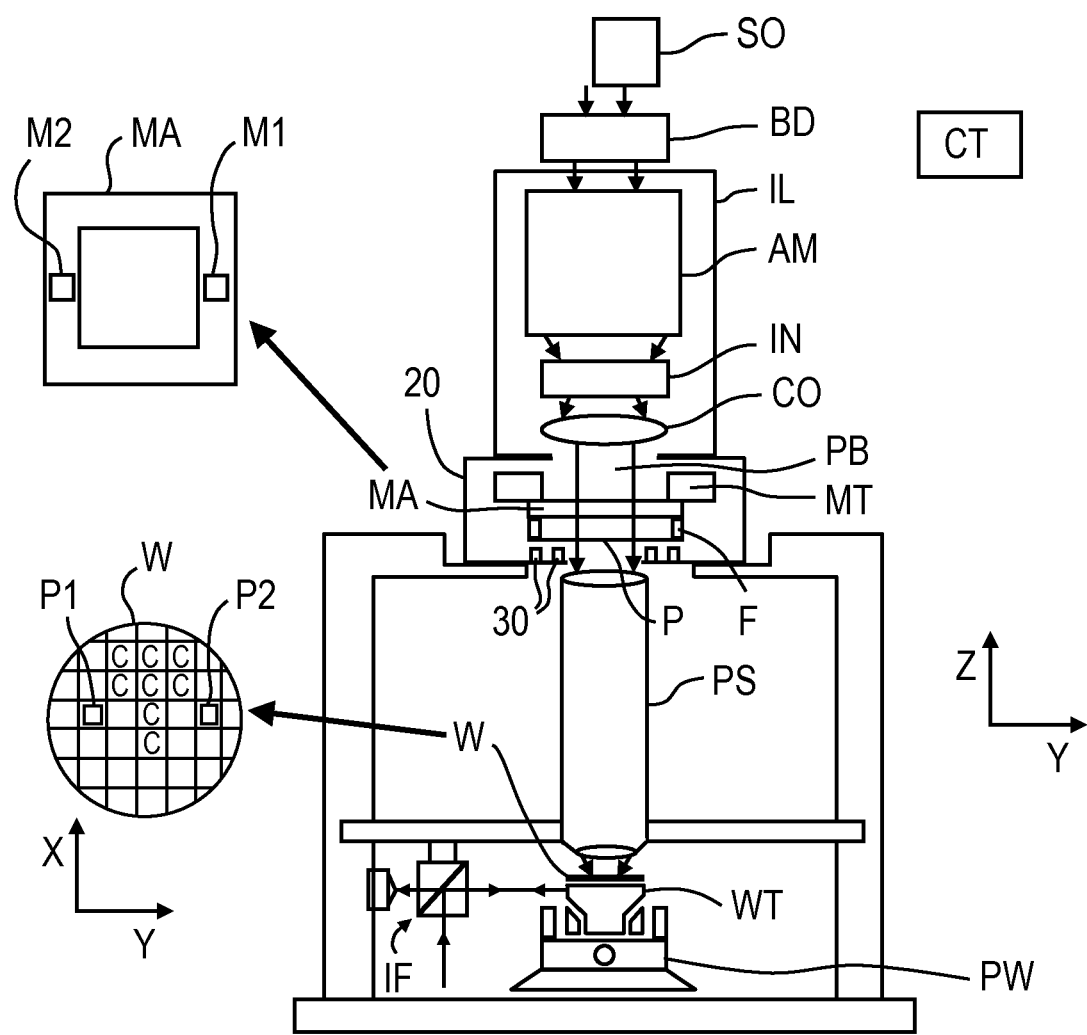
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm).

The support structure holds a mask (which may also be referred to as a reticle). It holds the mask in a way depending on the orientation of the mask, the design of the lithographic apparatus, and other conditions. The support structure can use mechanical clamping, vacuum, or other clamping techniques, for example electrostatic clamping under vacuum conditions. The support structure may be a frame or a table, for example, which may be movable as required and which may ensure that the mask is at a desired position, for example with respect to the projection system.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL configured to condition a beam PB of radiation (e.g. UV radiation or DUV radiation).

a support structure MT supporting a mask MA, the support structure being connected to a positioning device (not depicted) to accurately position the mask with respect to item PL;

a substrate table (e.g. a wafer table) WT for holding a substrate (e.g. a resist coated wafer) W and connected to a positioning device PW for accurately positioning the substrate with respect to item PL; and a projection system (e.g. a refractive projection lens) PL configured to image a pattern imparted to the radiation beam PB by mask MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

A pellicle P is attached to a frame which is in turn attached to the mask MA. The pellicle P is a transmissive film which is spaced away from a pattern on the mask. The pellicle P prevents contamination particles from being incident upon the pattern of the mask, and holds such contamination particles away from the mask pattern. The pellicle P may for example be separated from the mask pattern by a few mm, e.g. around 5 mm. The mask MA, frame F and pellicle P are all located within an environment defined by a housing 20. Pressure sensors 30 are located on a floor of the housing 20. The pressure sensors 30 are configured to monitor pressure of gas (e.g. air) in the housing during scanning movement of the mask MA, frame F and pellicle P.

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively)

of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the mask MA, which is held by the support structure MT. Having traversed the mask MA, the beam PB passes through the pellicle P and then passes into the projection system PS. The projection system focuses the beam PB onto a target portion C of the substrate W. With the aid of the positioning device PW and position sensor IF (e.g. an interferometric device), the substrate table WT can be moved accurately, e.g. so as to position different target portions C in the path of the beam PB. Similarly, the support structure MT can be used to accurately position the mask MA with respect to the path of the beam PB, e.g. during a scanning exposure. Mask MA and substrate W may be aligned using mask alignment marks M1, M2 and substrate alignment marks P1, P2.

The lithographic apparatus may be used to perform a scanning exposure. In a scanning exposure the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the de-magnification and image reversal characteristics of the projection system PS.

The lithographic apparatus further comprises a controller CT. The controller CT is configured to output adjustments to be applied to the lithographic apparatus during scanning exposures. The adjustments may comprise adjustments of lenses of the projection system PS. The controller may comprise a processor configured to perform a method according to an embodiment of the invention (e.g. a method as described below). The controller may comprise a computer.

It has been understood for some time that the pellicle P will have an effect upon the patterned radiation beam PB which passes through it. However, consideration of the effect of the pellicle has been limited to treating the pellicle as though it has the form of a planar sheet which is transverse to the radiation beam PB. It has now been determined that the pellicle P deflects dynamically during a scanning exposure. This dynamic deformation introduces aberrations into the image projected by the lithographic apparatus onto the substrate W. Embodiments of the invention address this issue and allow the aberrations to be reduced.

Figure 2:
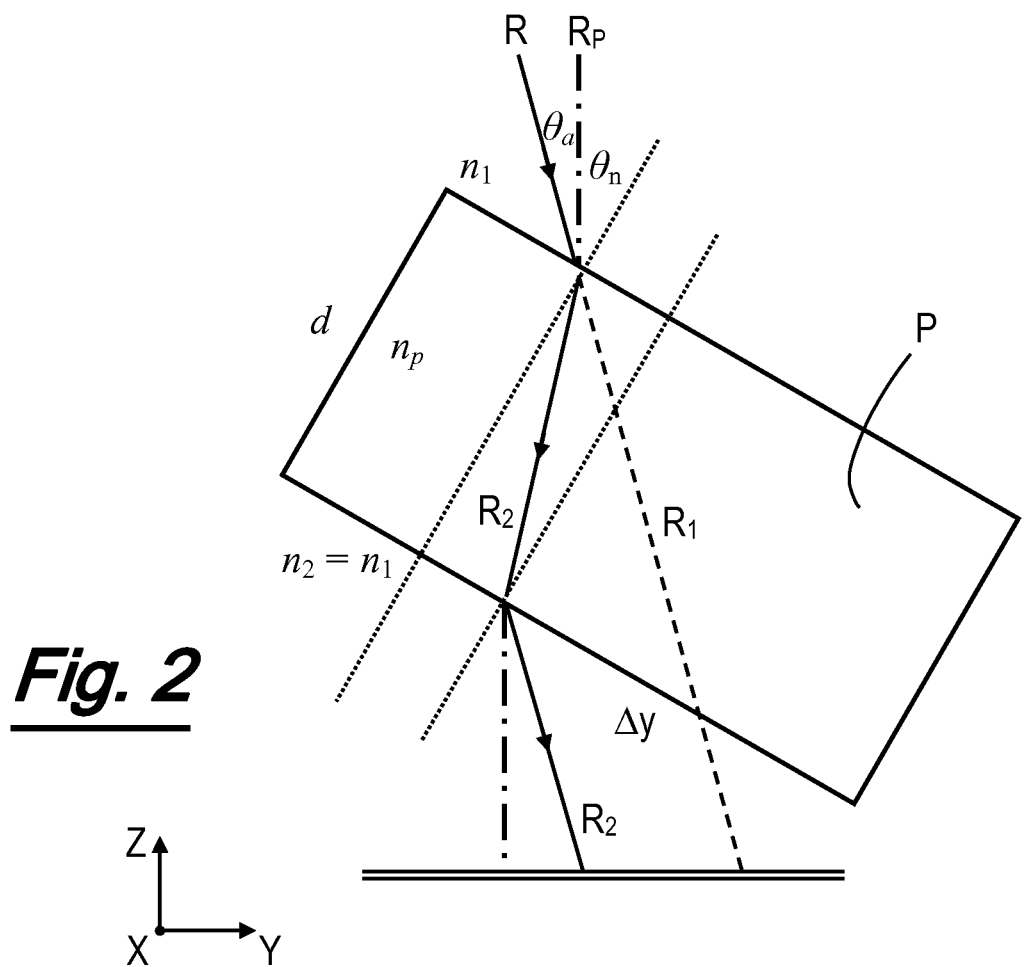
FIG. 2 schematically depicts the effect of a pellicle upon a radiation beam.

FIG. 2 schematically illustrates an offset of a radiation beam which will be caused by the pellicle P when the pellicle (or part of the pellicle) is at an angle relative to the optical axis of the lithographic apparatus. To aid explanation of the offset Cartesian coordinates are included in FIG. 2. The Cartesian coordinates, which are also used in other figures, are in accordance with the convention for a scanning lithographic apparatus. The y-direction is the scanning direction (i.e. the direction of movement during a scanning exposure), the x-direction is in the plane of the mask in the non-scanning direction, and the z-direction is the optical axis of the lithographic apparatus.

The pellicle P has a refractive index $n_p$ which is greater than the refractive index $n_1$, $n_2$ of the gas (e.g. air) on either side of the pellicle. The pellicle has a thickness d. The offset introduced by the pellicle P is in accordance with Snell's Law and is determined in part by the thickness of the pellicle and the refractive index of the pellicle. In addition, because the pellicle is at an angle relative to the XY-plane, the XY offset is further determined by the angle of the pellicle relative to the XY plane. The principal ray $R_p$ of the system is shown as a dotted and dashed line, and a ray R at an angle $\theta_a$ relative to the principal ray $R_p$ is also shown. A dashed line $R_1$ shows how the ray R would propagate if no pellicle were present. The solid line $R_2$ shows how the line propagates when pellicle P is present. As may be seen, there is a significant shift $\Delta y_p$ in the y-direction of the ray $R_2$ compared with the ray $R_1$ that would be seen if the pellicle P was not present. As may also be understood from FIG. 2, the displacement of the ray R depends in part upon the angle of the pellicle P with respect to the XY-plane. The principle ray $R_p$ will be shifted by a lesser amount than the ray R. A ray (not shown) which is perpendicular to the pellicle P will not be shifted.

Figure 3:
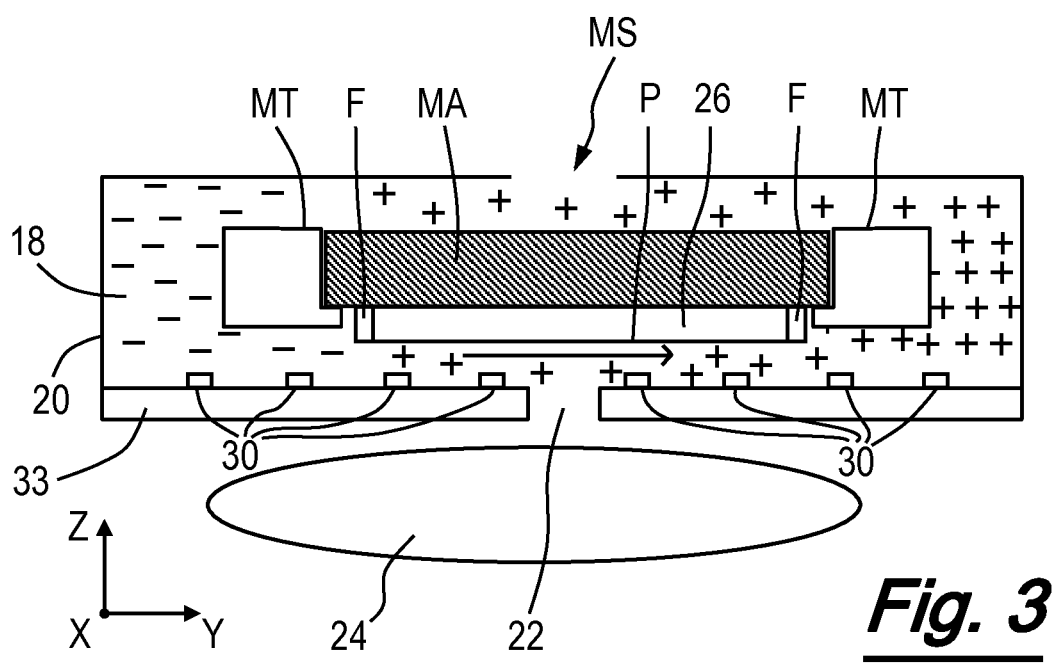
FIG. 3 schematically depicts part of the lithographic apparatus of FIG. 1 in more detail.

FIG. 3 schematically depicts in more detail part of the lithographic apparatus of FIG. 1. As in FIG. 1, a pellicle P is fixed to a pellicle frame F which in turn is attached to a mask MA. The mask MA is attached to a support structure MT. The pellicle P, pellicle frame F and mask MA may be referred to as a mask assembly MS. The mask assembly and the support structure MT are located in an environment 18 defined by a housing 20. The environment 18 defined by the housing may be referred to as the mask assembly environment 18.

The housing 20 is open at an upper end, opposite the mask MA, to receive a radiation beam PB (see FIG. 1) and is open at a lower end, opposite the pellicle P, to allow the patterned radiation beam to travel to the projection system PS of the lithographic apparatus (see FIG. 1). The lower opening 22 may be referred to as an exposure slit 22. An uppermost lens 24 of the projection system PS (see FIG. 1) is schematically depicted in FIG. 3.

Gas, for example air, is present in the mask assembly environment 18. The gas may be provided at a pressure which is higher than the pressure in the projection system PS in order to inhibit contamination particles from travelling from the projection system into the mask assembly environment 18.

A volume 26 is enclosed by the pellicle P, mask MA and frame F. Gas is contained in the volume 26. The volume is connected to the mask assembly environment 18 by a leakage path (not depicted) which allows gas (e.g. air) to flow between them. The leakage path is restricted such that the rate at which gas may travel between the volume 26 and the mask assembly environment 18 is limited. The rate of flow is sufficiently low such that during a scanning exposure an amount of gas in the volume 26 may be considered to be fixed.

During a scanning exposure, the support structure MT and mask assembly MS move rapidly from one side of the housing 20 to the other side in the y-direction (as indicated by the arrow in FIG. 3). The scanning exposure may for example be performed within around 100 milliseconds.

As is schematically depicted in FIG. 3, during the scanning movement of the mask assembly MS from left to right, the pressure of gas at the right hand side of the mask assembly MS and support structure MT will increase because the volume containing that gas is being reduced. At the same time, the pressure on the left hand side of the mask assembly MS and support structure MT is reduced because the volume containing that gas is increased. As a result, the gas flows around the mask assembly MS and support structure MT until the gas pressure has equalized in the mask assembly environment 18. This flow of gas causes a dynamic deformation of the pellicle P (i.e. a deformation which changes during the scanning movement of the pellicle). The dynamic deformation consists of bending of the pellicle P, and this introduces aberrations into the image that is projected by the lithographic apparatus LA onto the substrate W. As explained above in connection with FIG. 2, when the pellicle P is at an angle relative to the mask MA this introduces an offset into the projected image. Because the pellicle bends and thus has a range of angles relative to the mask the pellicle doesn't introduce a simple offset but instead introduces aberrations into the projected image. Furthermore, the aberrations introduced by the pellicle vary during the scanning exposure. This is because the patterned radiation beam RB passes scans along the pellicle P during scanning movement of the mask assembly MS, and different parts of the pellicle will be bent in different ways.

Figure 4:
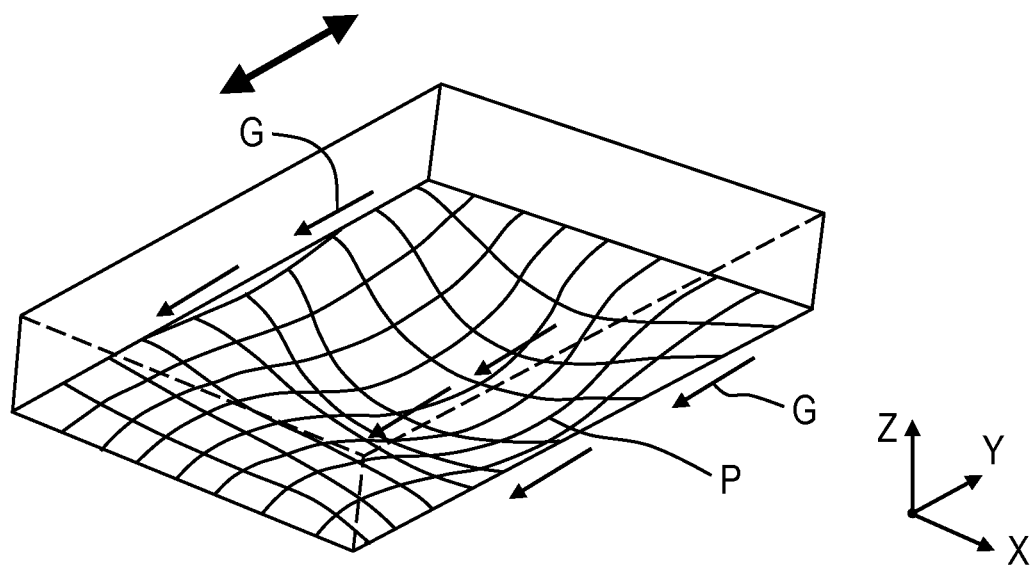
FIG. 4 schematically depicts pellicle deformation caused by gas flowing beneath the pellicle during a scanning movement of the pellicle.

FIG. 4 schematically depicts an example of pellicle deformation that may occur during scanning movement of the mask assembly. As is schematically indicated in FIG. 4, scanning movement of the pellicle P is in this example in the Y-direction. Flow of gas (e.g. air) close to the surface of the pellicle is schematically indicated by arrows G.

As mentioned further above, the amount of gas in the volume 26 between the pellicle P and the mask MA is effectively fixed during a scanning exposure. Furthermore, the gas within the volume G will tend to resist compression or expansion. As a result, the total volume enclosed by the pellicle P will remain substantially constant such that any outward expansion of one part of the pellicle P will tend to be matched by a corresponding inward movement of another part of the pellicle. An example of this form of deformation of the pellicle P is depicted in FIG. 4. A portion of the pellicle P towards the left-hand end of the Figure has bulged outwards, and a portion of the pellicle towards the right-hand end of the Figure has bulged inwards by a corresponding amount. Thus, the volume enclosed by the pellicle P remains substantially constant. This form of deformation of the pellicle may be considered as being similar to the movement of the surface of a waterbed, i.e. it is similar to movement of a flexible membrane which encloses a volume of substantially incompressible fluid.

The aberrations caused by the pellicle in the projected image during a scanning exposure are relatively complex, i.e. they include several orders of Zernikes. However, the aberrations are relatively consistent. That is, when a given mask assembly with a particular pellicle is used to perform a scanning exposure in a given lithographic apparatus, the aberrations caused by the pellicle will be generally the same as the aberrations caused during a previous exposure. This will be the case provided that the speed and direction of the scanning exposure is the same, and provided that the background pressure of gas in the mask assembly environment is the same (i.e. the pressure of gas when the mask assembly MS is not moving). For a scanning exposure with the same speed but in opposite direction the aberrations caused by the pellicle will be reversed.

The pressure sensors 30 located in a floor 33 of the housing 20 (see FIG. 3) are configured to measure pressure inside the housing 20 during scanning movement of the mask assembly MS (and support structure MT). The pressure sensors 30 may for example comprise moveable diaphragms attached to a magnet (e.g. in the form of a microphone). The pressure sensors may for example be MEMs microphones.

The pressure sensors 30 may be provided in a single series which extends in the Y-direction along the floor 30 of the housing 20. A two-dimensional array of pressure sensors is not needed because the bending of the pellicle P in the X-direction generally behaves in a simple manner. That is, the pellicle P either bends upwards shaped as a second-order polynomial, or bends downwards shaped as a second order polynomial (the pellicle may have X-direction symmetry with reference to an axis which bisects the pellicle in the X-direction). This X-direction symmetry (and the second-order polynomial shape of the pressure along the exposure slit) arises the mask assembly MS and support structure MT are designed to provide pressure which is substantially equal along the X-direction (they are designed with X-direction symmetry). As a result, complex curves will preferentially occur in the Y-direction rather than in the X-direction (e.g. as depicted in FIG. 4). Consequently, a single series of pressure sensors 30 which extends in the Y-direction may sufficiently characterise the pressure profile to allow the pressure across the entire pellicle P to be determined. However, in embodiments the pressure along the X-direction may also be measured with additional pressure sensors.

A second series of pressure sensors may be provided if desired. The second series of pressure sensors 30 will provide additional pressure measurements. These additional measurements may be used to provide combined measurements which have improved measurement accuracy and/or consistency. If a second series of sensors is provided then in the event of failure of one of the sensors of the first series, measurements from the corresponding sensor of the second series may be used. More than two series of sensors may be used.

Although a series of eight pressure sensors 30 is depicted, this is merely an example. In general, a plurality of pressure sensors may be used. At least one pressure sensor may be provided at either side of the opening 22 in the floor 33 of the housing 20. A plurality of pressure sensors may be provided on each side of the opening 22 in the scanning direction (Y-direction). More than two pressure sensors may be provided on each side of the opening 22. Sufficient pressure sensors may be provided to allow a shape of distortion of the pellicle P to be characterised (the pressure-profiles may have various different shapes, leading to different shapes in pellicle deformation).

Figure 5:
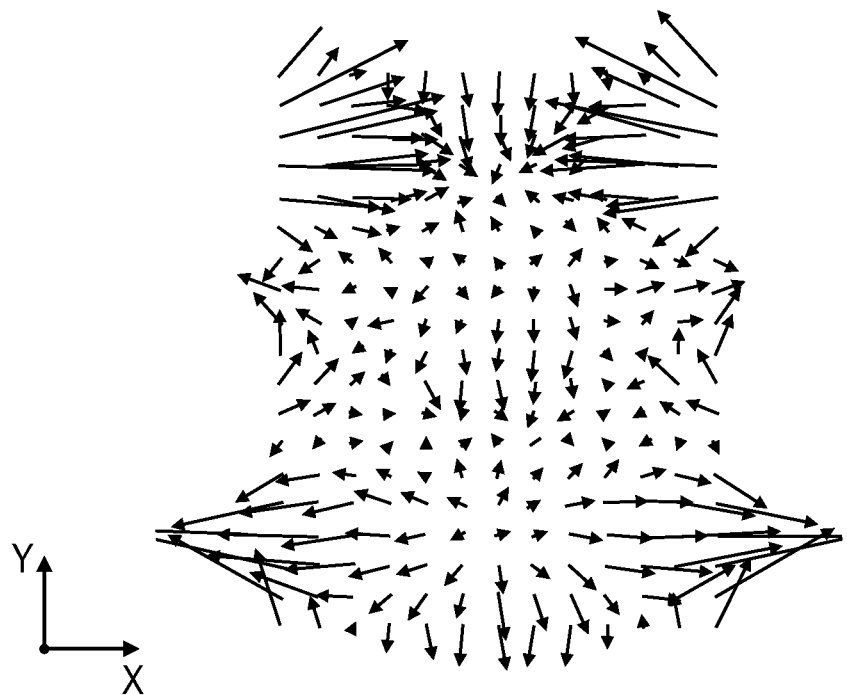
FIG. 5 depicts x,y distortion of an image projected using the lithographic apparatus, the distortion having been caused by pellicle deformation.

It has been found that XY-distortions in images projected by a lithographic apparatus which are caused by deformation of the pellicle have a strong correlation with the pressure variation which occurs at the pellicle during a scanning exposure. Aberrations caused by the pellicle in a projected image may be referred to as "the fingerprint of the pellicle", and pressure variation at the pellicle during a scanning exposure may be referred to as "the pressure profile". An example of a typical fingerprint of aberrations caused by a pellicle is shown in FIG. 5. The arrows in FIG. 5 indicate deviations of points in an image from the intended positions of those image points. These deviations may be referred to as XY-distortion. Since the pellicle fingerprint correlates strongly with the pressure profile, measurements of the pressure profile may be used to determine adjustments of the lithographic apparatus during scanning exposure which compensate for the pellicle fingerprint. In this context the term "compensate" may be interpreted as meaning reducing the effect of the pellicle fingerprint, and does not require that the effect of the pellicle fingerprint is entirely removed. The compensation may, for example, be provided by adjusting lenses of the projection system PS (see FIG. 1) during the scanning exposure.

The adjustment of the projection system PS which is applied may be a feed-forward correction. That is, the correction which will be applied during a scanning exposure may be determined before that scanning exposure takes place. This is possible because, as mentioned above, the pellicle P will distort in a consistent manner during scanning exposures provided that some conditions remain constant. These conditions are the length and speed of scanning exposure, and physical properties of the mask assembly and other components in the housing 20.

The distortion of the pellicle P caused by gas flow during scanning movement will be affected by the separation between the pellicle P and the floor 33 of the housing 20. This is in part determined by properties of the lithographic apparatus, and in part determined by properties of the mask assembly MS. For example, the frame F to which the pellicle P is attached may have a height of 3 mm, may have a height of 5 mm or may have some other height, and this height will affect the size of the gap between the pellicle P and the floor 33 of the housing 20. The distortion of the pellicle P is also affected by the shape of the mask assembly environment 18 and the shape of components in that environment. In addition, the distortion of the pellicle P is affected by the speed of scanning movement of the pellicle (the distortion does not simply scale with speed but also changes form). Furthermore, the distortion is also affected by the length of the scanning movement.

Different pellicles may be held at different tensions, and this will affect distortion of the pellicle. The tension of the pellicle may have a scaling effect upon the distortion of the pellicle without changing the form of the distortion. The parameter "tension" may incorporate the thickness of the pellicle (as is explained further below).

Models which take into account the above parameters can be used to accurately predict the deformation of a pellicle P during scanning exposure of a substrate. An example of the generation of such models and the manner in which the models are used is described below in connection with the flowchart of FIG. 6.

Figure 6:
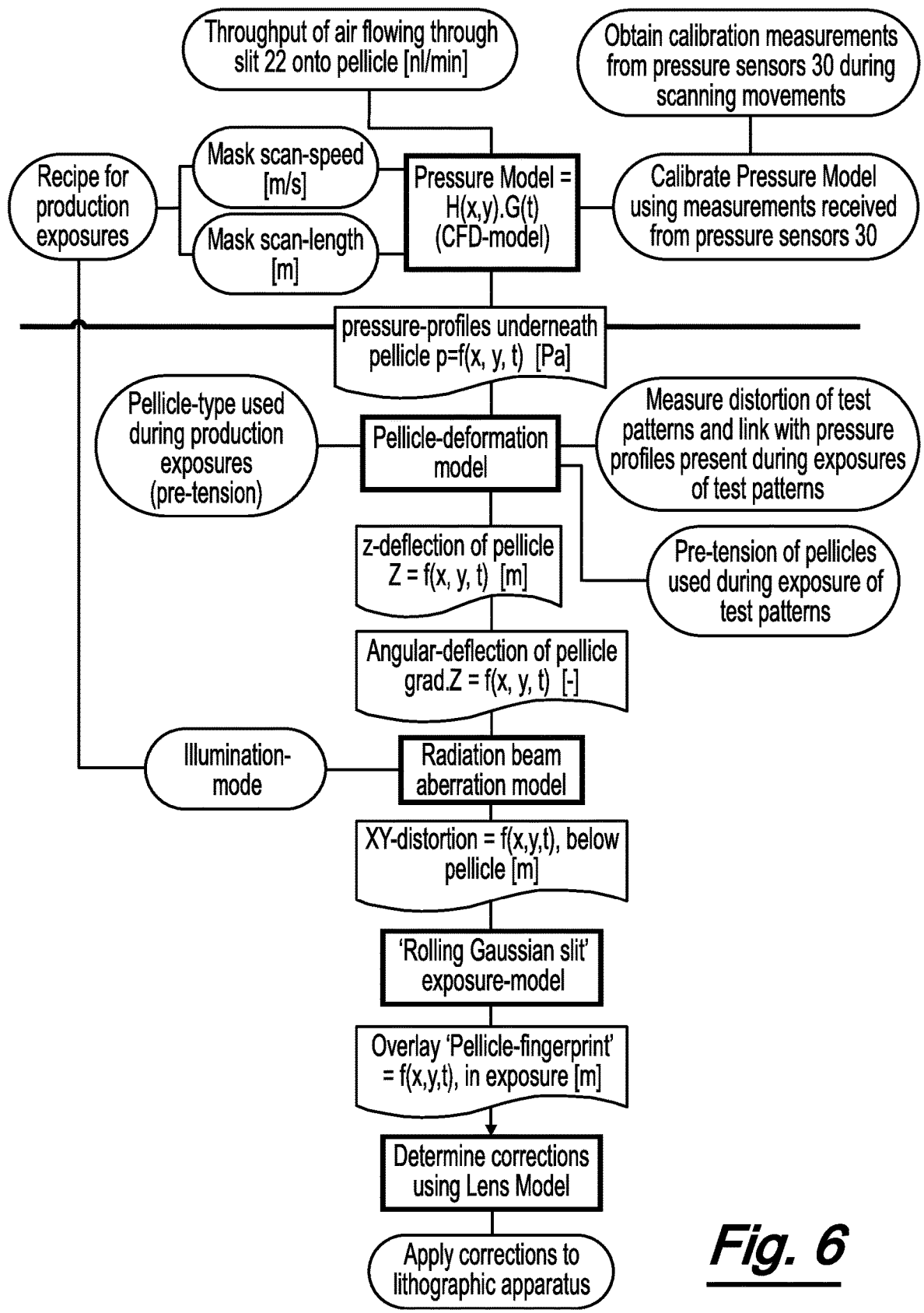
FIG. 6 is a flow chart of a method according to an embodiment of the invention.

The flowchart of FIG. 6 sets out a method according to an embodiment of the invention which may be used to compensate for aberrations caused by distortion of the pellicle P during scanning exposures performed by a lithographic apparatus. The corrections may, for example, be applied during production exposure of substrates, e.g. during exposure of a series of wafers with dies which will form integrated circuits. In overview, the method comprises using a model to determine the pressure profile underneath the pellicle during a scanning exposure, then using a further model to determine the deformation of the pellicle which occurs due to the pressure profile. The method further comprises using a radiation beam aberration model to determine how the radiation beam PB is distorted by the pellicle, and applying a rolling Gaussian slit exposure-model to take account of the scanning nature of the exposure and thereby determine the fingerprint of the pellicle. The method further comprises using a lens model to determine adjustments of the projection system PS to be applied in order to compensate for the pellicle fingerprint. Because the pellicle distorts in a consistent manner for scanning exposures, the calculations performed by the various models may be performed in advance of the scanning exposure, with the adjustments to be applied to the projection system PS being stored in a memory. The adjustments are then retrieved from the memory and applied to the projection system PS during the scanning exposure. Different adjustments may be calculated for different lengths and speeds of scans, and for different types of pellicle (e.g. pellicles with different thicknesses and tensions).

As noted further above, the distortion of the pellicle is inverted when the direction of scanning exposure is reversed. Therefore, two sets of adjustments may be stored in the memory, one for each direction of scanning exposure. When scanning exposures are performed at an edge of the wafer, these may be shorter and/or slower than scanning exposures performed away from the edge of the wafer. As a result the pellicle deformation will be different when these exposures are performed. Consequently, additional sets of adjustments of the projection system PS may be stored in the memory to be used when exposures take place at the edge of the wafer.

The example method of FIG. 6 will now be described in more detail. The model which is used to determine the pressure profile underneath the pellicle during the scanning exposure may be a computational fluid dynamics (CFD) model which models movement of the gas (e.g. air) in the mask assembly environment 18. The CFD model may use Navier-Stokes equations. The shape and size of the mask assembly environment 18 as defined by the housing 20 is known, as are the shapes and sizes of the openings at the top and bottom of the housing. Similarly, the shape and size of each of the components in the mask assembly environment 18 is known. Using these parameters the CFD pressure model can be used to determine how gas flows in the mask assembly environment 18 during scanning movement of the mask assembly MS and support structure MT. This can be determined for a range of scan speeds and scan lengths. There may be some flow of gas through the slit 22 onto the pellicle. Such flow, if present, will cause some distortion of the pellicle and is therefore also included in the CFD pressure model.

As mentioned further above, the pressure profile underneath the pellicle P will vary depending upon the size of the gap between the pellicle P and the floor 33 of the housing 20. This will vary between different lithographic apparatus (there is some tolerance in the gap such that the size of the gap may be different even for lithographic apparatus of the same type). Therefore, for a given lithographic apparatus in a production environment, the CFD pressure model is calibrated by performing scanning movements of the mask assembly MS and support structure MT and by measuring pressure values using the pressure sensors 30. The calibration may be performed without exposing a substrate, and may be performed without moving the substrate table MT. The calibration may be performed for a variety of different scan speeds and scan lengths, including those which will be used during production exposures. Calibration scans may be performed using pellicles attached to pellicle frames of different heights. Pellicle frames typically have a height of 3 mm or 5 mm, and performing calibration scans using pellicles attached to frames with these two heights may be sufficient. If production exposures will always be performed with pellicles attached to frames of one height then calibration scans may be performed using a pellicle attached to a frame with that height.

If heating of the pellicle P by the radiation beam PB is expected to have a significant effect (e.g. reduction of tension in the pellicle due to thermal expansion), then the calibration may be performed whilst the radiation beam is incident upon the pellicle. Alternatively, the effect of heating caused by the radiation beam on the tension of the pellicle P can be calculated and added to the model (using the coefficient of thermal expansion of the pellicle). The temperature of the pellicle P can be expected to increase in a known manner as a function of time, and may for example increase at the same rate as the temperature of the mask MA.

Heating of the mask may be subject of a separate pre-existing model and the temperature of the pellicle P may be derived from that model.

The data obtained from the pressure sensors 30 during the calibration scans is used to calibrate the CFD pressure model. The pressure sensors 30 provide absolute measurements of pressure at the locations of the pressure sensors, for scans of different speeds and lengths. The CFD pressure model is adjusted (e.g. scaled) such that its outputs at the positions of the pressure sensors match the measurements provided by the pressure sensors 30. The calibration of the CFD pressure model thus matches the CFD model to reality as measured by the pressure sensors 30.

The calibration addresses the dependency of the pressure profile in the mask assembly environment 18 and at least facing the pellicle upon the layout of the components in the mask assembly environment 18 and properties of the scanning movement of the pellicle. It does not address properties of the pellicle P itself such as tension of the pellicle. This is instead separately addressed by the pellicle deformation model. This separation, which is indicated schematically by the horizontal line in FIG. 6, is advantageous because it provides separation of the effect of the layout of the components in the mask assembly environment 18 and the effect of the properties of the pellicle P. This means that the outputs from the pressure profile model remain usable even if the pellicle P is replaced with a different pellicle P which has different properties (e.g. a different tension).

Once the CFD pressure model has been calibrated using the measurements from the pressure sensors 30, the pressure profiles which will occur underneath the pellicle P during production scanning exposures for that lithographic apparatus with a mask MA protected by a pellicle P are determined. The pressure profiles output by the CFD pressure model are provided as inputs to a pellicle deformation model. The pellicle deformation model may for example have the form:

$$\text{Pellicle Tension} * \left( \frac{d^2 z}{dx^2}(x, y, t) + \frac{d^2 z}{dy^2}(x, y, t) \right) = P_{outer\_variation\ over\ (x,y)}(x, y, t)$$

The term "tension" in this document is intended to mean a force per distance (in a plane of the pellicle). The tension may be expressed in terms of N/m. This differs from a force per cross-sectional area (i.e. the area that would be seen if the pellicle was cut through), which would be expressed in terms of $N/m^2$. Tension can be calculated by multiplying the force per cross-sectional area by the thickness of the pellicle. Thus, tension in this document takes into account the thickness of the pellicle.

In the above equation the term $P_{outer\_variation\ over\ (x,y)}$ refers to the pressure in an environment between the projection system and the pellicle, and refers to the pressure after the average pressure over (x,y) has been subtracted. In other words, the term relates to pressure variation outside the pellicle. The average pressure outside the pellicle does not have a significant effect because global movement inwards or outwards of the pellicle is resisted by the pressure of air inside the pellicle (i.e. between the pellicle and the mask).

The pellicle deformation model may be previously generated (e.g. in a test environment). The pellicle deformation model may be generated by exposing test substrates using a mask MA provided with a test pattern and protected by a pellicle P of a given type (e.g. having a given tension). Patterns exposed on the substrates may for example be measured using a metrology tool or using an alignment system which forms part of the lithographic apparatus. From these measurements distortion of the pellicle P is determined. The pressure sensors 30 (in combination with pressure-profiles as determined by the CFD model) may be used to determine pressure-profiles in the environment of the pellicle P during these exposures to generate data which links the pressure profile to the pellicle deformation. The pellicle deformation model may also receive as input the tension of the pellicle used during the exposures. Principal component analysis or other modelling techniques may be used to generate the pellicle deformation model, which links the pressure profile in the mask assembly environment which is at least opposite the pellicle (and tension of the pellicle) to deformation of the pellicle. Constraints applied during generation of the model may include that edges of the pellicle are fixed and that distortion of the pellicle is symmetric in the X-direction. Symmetry of distortion in the X-direction arises from X-direction symmetry in the lithographic apparatus. may be performed for different pellicle types in order to allow the model to take account of those different pellicle types. The effect of different pellicle types (e.g. pellicles with different tensions) may simply be a scaling of the pellicle distortion which occurs during scanning movement of the pellicle.

The lithographic apparatus which will be used for production exposures may have already been provided with the pellicle deformation model. The pellicle type which will be used for production exposures is input into the model. The pressure profiles underneath the pellicle are also input into the model. The model provides as outputs deflection of the pellicle in the Z-direction and also angular deflection of the pellicle.

Parameters which are associated with the pellicle type may include the tension, thickness and refractive index of the pellicle. A calibration which measures the effect of these parameters may be performed previously, for example in a non-production environment. The calibration may comprise exposing substrates with a mask provided with a measurement pattern, in combination with different pellicle types (e.g. pellicles with different tensions and/or thicknesses and/or refractive indices). The results of this calibration are independent of the lithographic apparatus which is used to obtain them. Therefore, the calibration may be performed once and then the results of the calibration may be used for a variety of different lithographic apparatus. The calibration may include operating a correction loop in which lenses of the projection system are adjusted and the extent to which these adjustments improve the image exposed in resist on a substrate is monitored.

A radiation beam aberration model receives as input the deflection of the pellicle and also receives as input the illumination mode which will be used during production exposures. The radiation beam aberration model may for example be a ray deflection model, which may be a model which implements Snell's Law (described above in connection with FIG. 2). Alternatively, the radiation beam aberration model may be a more advanced model which models Zernikes aberrations of the radiation beam which are caused by the deformation of the pellicle (a model of this type treats the pellicle as a lens element).

The output from the radiation beam aberration model is input to a rolling Gaussian slit exposure model. This model addresses the movement of the pellicle and mask relative to the radiation beam during a scanning exposure (e.g. as a convolution), and provides as an output the pellicle fingerprint which is caused by the pellicle deformation. An example of a pellicle fingerprint is depicted in FIG. 5. The pellicle fingerprint indicates how points in an image are displaced due to the effect of the pellicle distortion.

Finally, a lens model is used to determine corrections to be applied to lenses of the projection system PS in order to compensate for the pellicle fingerprint. Such lens models are well-known in the art and the lens model is therefore not described here. The correction may for example be able to apply $4^{th}$ order polynomial corrections in the Y-direction.

Figure 7:
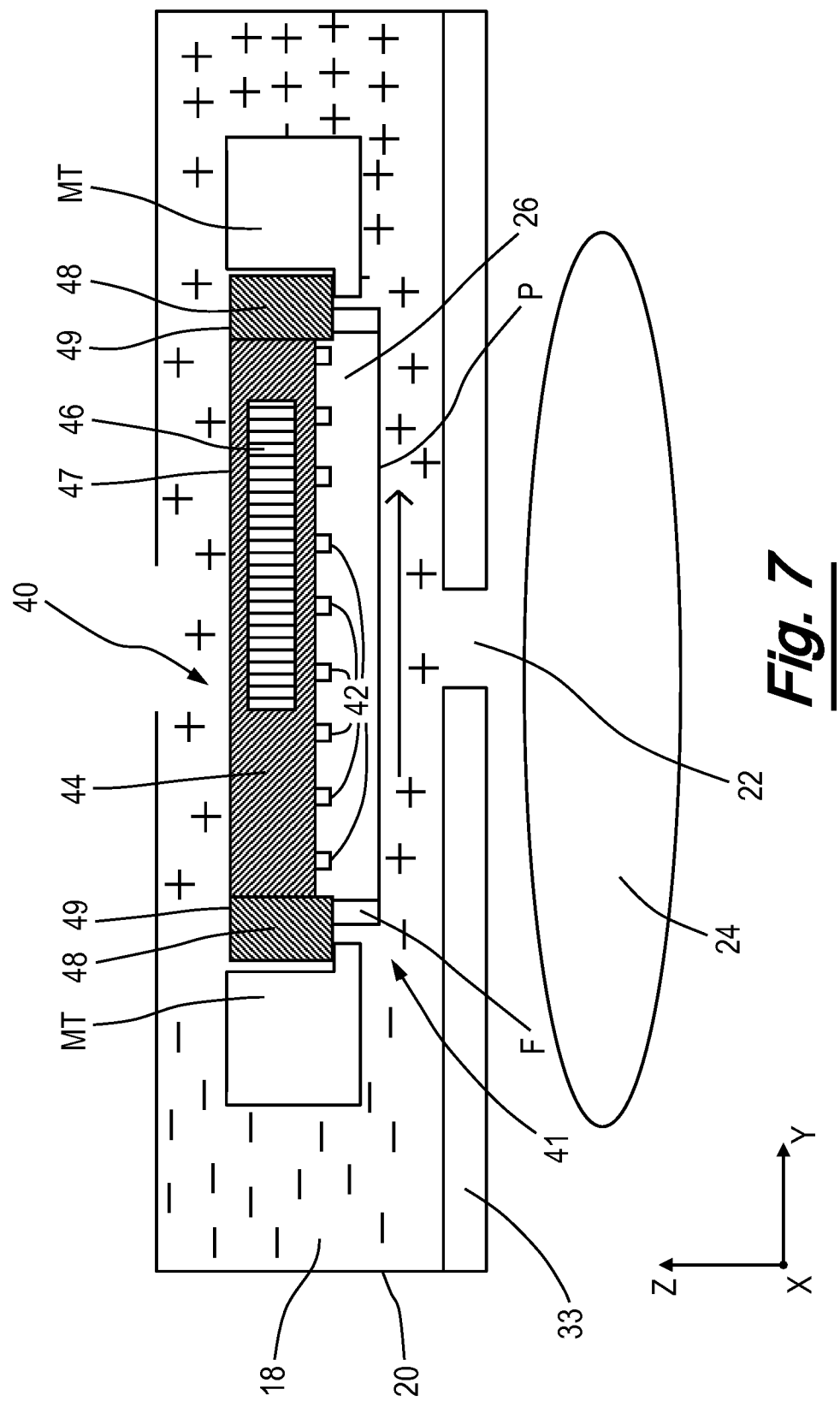
FIG. 7 schematically depicts a sensing system according to an embodiment of the invention, and part of a lithographic apparatus.

The corrections to be applied to the lenses are determined before production exposures take place. The corrections are then applied during production exposures and thus compensate for the pellicle fingerprint during those exposures An alternative embodiment of the invention is depicted schematically in FIG. 7. FIG. 7 includes some elements which correspond with elements depicted in FIG. 3. Where this is the case corresponding reference numerals have been used.

In the alternative embodiment instead of holding a mask assembly, the support structure MT holds a sensing system assembly 41. The sensing system assembly 41 includes a sensing system 40 which comprises a two-dimensional array of pressure sensors 42 (which may alternatively be referred to as microphones or acoustic sensors). The pressure sensors 42 may be MEMS devices. The pressure sensors are 42 provided on a support structure 44 which may for example be a substrate or frame. The support structure 44, which may be referred to as a sensor support structure, also holds electronics 46, for example a processor, a memory and/or a transmitter. The sensor support structure 44 in this embodiment is held by a support frame 48 which has outer dimensions that correspond with dimensions of a conventional mask MA (see FIG. 3). The support structure 44 has a substantially flat upper surface 47. The support frame 48 also has a substantially flat upper surface 49. The upper surface of the support structure 44 and the upper surface of the support frame 48 may be aligned such that together they provide a substantially continuous flat upper surface.

A pellicle frame F is attached to the support frame 48, and a pellicle P is fixed to the pellicle frame F. The pellicle P and frame F correspond with a pellicle P and frame F which may be attached to a mask and a when performing production exposures using lithographic apparatus. The sensing system 40, frame F and pellicle in combination constitute the sensing system assembly 41. The support frame 48 has a height which corresponds with the height of a conventional mask MA. As noted above, the sensing system 40 has a flat upper surface 47 which is aligned with a flat upper surface 49 of the support frame 48. Consequently, the outer dimensions of the sensing system assembly 41 correspond with the outer dimensions of a conventional mask MA, frame F and pellicle P (a conventional mask assembly).

Although the depicted embodiment comprises a sensor support structure 44 held by a support frame 48, other embodiments may have other forms. For example, the support frame 48 may be omitted. Where this the case the sensor support structure 44 may be held directly by the (mask) support structure MT.

The sensing system 40 may have a thickness which corresponds with the thickness of a conventional mask, e.g. around 6 mm.

In general, the sensing system 40 may have an outer surface (typically the upper surface) which is the same size as an upper surface of a mask (e.g. around 150 mm×150 mm, e.g. 152 mm×152 mm). When combined with a frame F and pellicle P to form a sensing system assembly 41, the sensing system assembly 41 may occupy a volume which corresponds with the volume of a conventional mask assembly. Thus, the mask assembly environment 18 (including the sensing system assembly) may be the same as the mask assembly environment during production exposures (including a conventional mask assembly). Thus, gas flow around the sensing system assembly 41 and support structure MT is the same as the flow of gas that will be seen around a mask assembly and support structure MT during production exposures. Hence, deflection of the pellicle P recorded using the sensing system 40 correspond with deflection of the pellicle which will occur during production exposures.

The pressure sensors 42 are provided as a two dimensional array. They may be distributed across a lower surface of the sensor support structure 44 (an inner surface of the sensor support structure). The pressure sensors 42 may be arranged in a rectangular grid. A separation of the order of centimetres (e.g. around 2 centimetres) may be provided between adjacent sensors. In other words, the pressure sensors 42 may be provided in a regular arrangement with a pitch in the X and Y direction of the order of centimetres (e.g. 2 centimetres).

The electronics 46 are configured to receive output signals from the pressure sensors 42 which indicate the pressures at those sensors. The electronics 46 may include a processor which is configured to convert the received pressure signals into data that describes deflections of the pellicle P during scanning movement of the sensing system assembly 41. The electronics may also include a memory and/or a transmitter.

In use, the support structure MT and sensing system assembly 41 are moved with a scanning motion in the y-direction (and in the −y-direction). These scanning movements may correspond with scanning movements of the support structure MT and mask assembly MS during production exposures. The pressure sensors 42 receive pressure measurements and these are converted by the electronics 46 into data which describes deflection of the pellicle P during the scanning movements. This information is stored for subsequent use during production exposures. When production exposures take place using a mask MA provided with pellicle P of the same type (e.g. a mask having the same thickness and same tension), the stored data indicating pellicle deflections during scanning movement are retrieved and are used to determine corrections which are applied to the lithographic apparatus during production exposures. The corrections which are applied reduce the distortion of images projected onto substrates during production exposures which would otherwise be caused by deflection of the pellicle.

The pellicle may for example measure around 110 mm×150 mm. Deflection of the pellicle during scanning exposures may have a relatively low spatial frequency (significantly less than 2 cm). Consequently the 2 cm (or order of cm) separation between the pressure sensors 42 may provide pressure measurements with a spatial frequency that is sufficiently high to allow accurate determination of the pellicle deflection.

The pressure sensors 42 may have a sampling frequency which is higher than the frequency of movement of the pellicle during scanning movements. The frequency of movement of the pellicle may for example be in the range 25 to 40 Hz. The pressure sensors 42 may for example provide output measurements with a frequency of up to around 100 Hz (e.g. up to around 200 Hz). The pressure sensors may 42 may be capable of detecting frequencies as low as 10 Hz.

In an embodiment the pressure sensors may be AKU242 digital silicon MEMS microphones available from Akustica, Inc. of Philadelphia, USA. Other MEMS microphones (pressure sensors) may be used, such as for example VM101 microphones available from Vespa Technologies, Inc0 of Massachusetts, USA.

Although the acoustic sensors 42 are not capable of monitoring for static deflection of the pellicle P, in practice this does not have a significant effect on the accuracy of measured pellicle deflection because all of the significant deflections of the pellicle are dynamic (i.e. they change during the scanning movement of the support structure MT).

Pellicle deflections of the order of millimetres occur. The sensing system 40 may be capable of determining pellicle deflections with an accuracy of the order of microns. This is sufficient to provide accurate characterisation of millimetre order deflections of the pellicle.

In general, the spatial pitch of the pressure sensors 42 and the frequency of output from the pressure sensors may be selected to be sufficiently high to allow deflection of the pellicle P to be effectively sampled and determined.

The electronics 46 may include a memory which stores data for subsequent use after measurements have been performed. The sensing system assembly 41 has the same dimensions as a conventional mask assembly MS, and thus may be loaded into and out of a lithographic apparatus in the same way as loading a conventional mask assembly into and out of a lithographic apparatus. When measurements performed using the sensing system 40 have been completed, the sensing system may be removed from the lithographic apparatus (in a conventional manner). Data stored in the memory may then be transferred to an external memory for subsequent processing by a processor. In an alternative arrangement, electronics 46 may include a transmitter which is arranged to wirelessly transmit data from the sensing system 40 to a receiver. The transmitter may for example use IEEE802.11 standards (Wi-Fi). An advantage arising from transmitting the data is that analysis of the data can begin before pressure measurements have been completed.

Because the pressure sensors 42 are provided in a two-dimensional array supported by a sensor support structure 44, it may not be possible to use the sensing system 40 as a conventional mask MA to pattern a radiation beam (the sensing system does not include a conventional mask and might not be patterned). Pressure measurements may be performed during scanning movements of the sensing system assembly 41 when a radiation beam is not incident upon the sensing system 40.

The sensing system assembly 41 may be constructed by modifying a conventional mask. The modification may comprise forming an opening in the mask with a perimeter which corresponds with the perimeter of the sensing system 40, thereby forming a mask frame 48. The sensing system 40 may then be inserted into that opening and secured the in place. The sensing system 40 may be secured to the mask frame 48 for example using adhesive.

An advantage of the embodiment is that the pressure sensors 42 provide monitoring of the complete pellicle area during scanning movements. The pressure sensors 42 move with the pellicle, thus ensuring that the entire pellicle is monitored during the scanning movements. A further advantage is that because the measurements are performed in an enclosed volume 26, significant flow of air over the pressure sensors 42 is not seen. Instead, air within the enclosed volume 26 will generally move with the movement of the sensing system 40 such that it appears to be stationary in a reference frame of the pressure sensors 42. This means that pressure differences measured by the pressure sensors 42 are caused by pellicle deflections and not by flow of air over the sensors. There may be some flow of air when the sensing system assembly 41 decelerates to change direction and then accelerates in the opposite direction. However, such air flow is short lived, with most pellicle deflections occurring during constant speed movement of the sensing system assembly 41. In addition, exposure of substrates generally takes place during constant speed and movement of a mask assembly, and hence deflections of the pellicle which occur during constant speed movement are of greatest importance (it is these deflections which affect the quality of images projected onto substrates).

Scanning movements performed when measurements are being obtained using the sensing system 40 may correspond with scanning movements made during production exposures. For example, different scanning movements may be made when exposing at different locations on a wafer and these may be replicated during the measurement scans. In one example shorter scans may be undertaken when exposing edges of a substrate, and these scans may also be performed when obtaining measurements using the sensing system 40. In this way, for a given production exposure the deflection of the pellicle P is determined prior to that production exposure taking place. The deflection of the pellicle as measured in advance corresponds with the deflection that will be seen during production exposures, and so correction of the lithographic apparatus which corrects for the deflection of the pellicle P may be calculated in advance. Pellicle behaviour is very consistent for a given pellicle type (i.e. a given pellicle thickness and tension) provided that the mask assembly environment 18 is unchanged. As noted further above, embodiments of the invention allow pellicle deflection to be measured in a given lithographic apparatus for a given pellicle type without changing the mask assembly environment. During subsequent production exposures in that lithographic apparatus with the same pellicle type, deflection of the pellicle will closely correspond with the previously measured deflection.

Acoustic holography, for example near-field acoustic holography, may be used to determine pressure fields at positions across the pellicle P. In other words pressure variations of the pellicle may be determined as a two-dimensional map of the pellicle. The map may have a separation between deflection values which corresponds with the separation between the adjacent pressure sensors 42 (e.g. around 2 centimetres). This separation between deflection values may be sufficient to characterise the deflection of the pellicle because deflections of the pellicle will occur with a relatively low spatial frequency (as noted further above).

When a pressure wave is generated the pressure wave propagates according to a propagator G;

$$G = e^{jk_z(z_s - z_h)}$$

where $z_s$ is the position in one dimension of the source of the pressure wave and $z_h$ is the position in one dimension of the pressure sensor. In embodiments of the invention the acoustic wave as received at the pressure sensors 42 is known. An inverse propagator may be used to inverse propagate the acoustic waves and determine deflection of the pellicle which caused the pressure waves. The inverse solution may be a deconvolution of a measurement plane (a plane in which the pressure sensors 42 are located) with Rayleigh's propagation kernel.

Dynamic deflections of the pellicle may have an upper frequency limit which is significantly less than around 200

Hz. Low pass filtering of signals output from the pressure sensors 42 may be applied such that signals with a frequency greater than around 200 Hz are excluded when the deflection of the pellicle is being calculated. This is advantageous because this avoids noise sensed by the acoustic sensors reducing the accuracy with which the pellicle deflection is calculated.

As noted further above a pellicle P has some known characteristics when it undergoes pellicle deflection. Edges of the pellicle 9 do not move because they are fixed to the frame F. The pellicle deflection may have x-direction symmetry (where y-direction is the direction of scanning movement). These limitations may be taking into account when calculating deflection of the pellicle using pressure measurements received by the pressure sensors 42.

Figure 8:
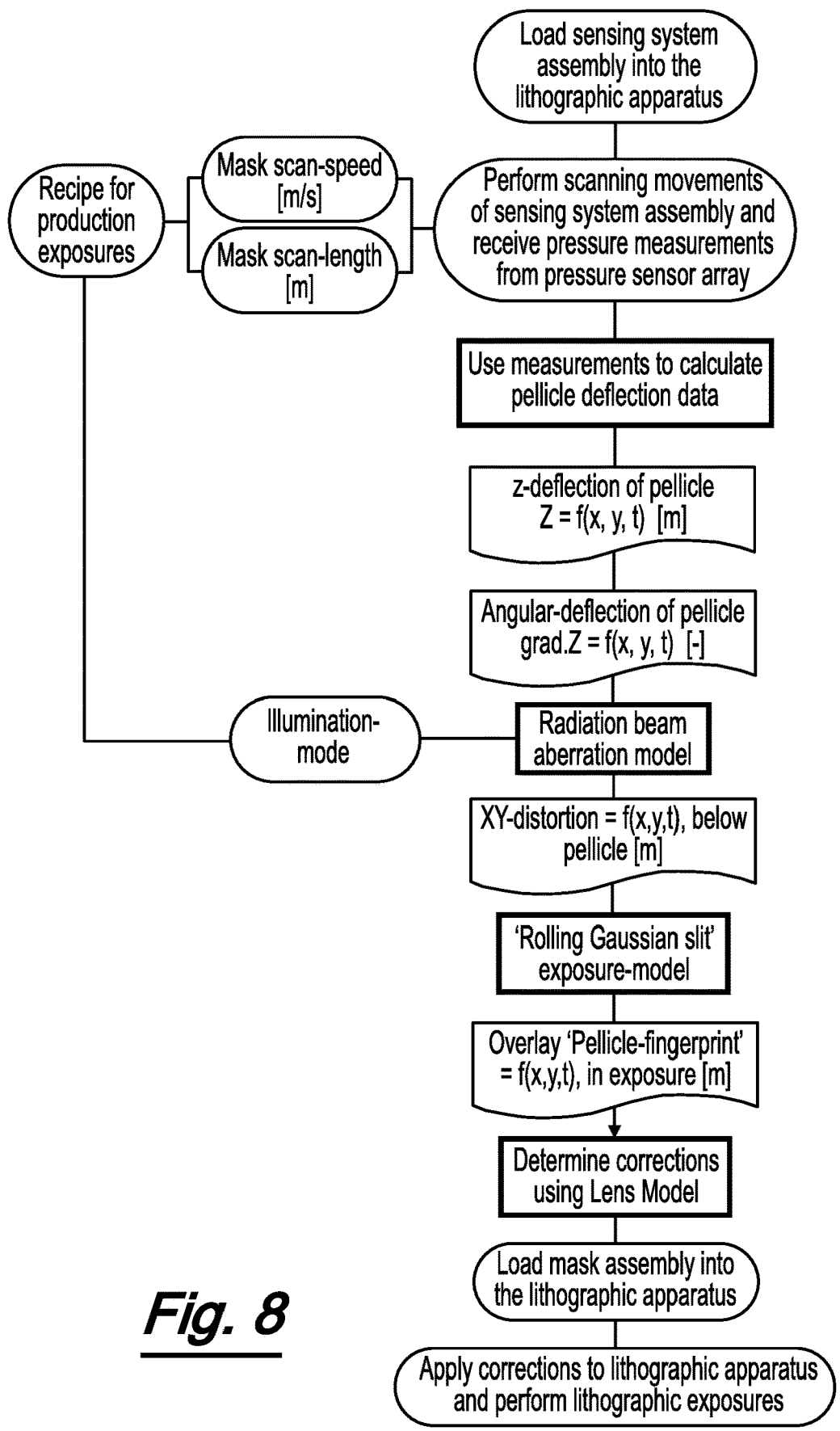
FIG. 8 is a flow chart of a method according to an embodiment of the invention.

FIG. 8 is a flowchart which sets out a method according to an embodiment of the invention that may be used to compensate for aberrations caused by distortion of the pellicle P during scanning exposures performed by a lithographic apparatus. The corrections may, for example, be applied during production exposure of substrates, e.g. during exposure of a series of wafers with dies which will form integrated circuits. In the method of FIG. 8 the sensing system assembly 41 is first loaded into the lithographic apparatus. Scanning movements of the sensing system assembly 41 are then performed, the scan speeds and scan lengths of those scanning movements corresponding with those that will be used during production exposures. Pressure measurements are received from the pressure sensors 42. The pressure measurements are used to calculate deflections of the pellicle P which occur during the scanning movements. The deflections may be expressed as z-direction deflections and angular deflections.

The remainder of the method set out in FIG. 8 corresponds with the method set out in FIG. 6. In overview, the remainder of the method comprises using a radiation beam aberration model to determine how the radiation beam PB is distorted by the pellicle, and applying a rolling Gaussian slit exposure-model to take account of the scanning nature of the exposure and thereby determine the fingerprint of the pellicle. The method further comprises using a lens model to determine adjustments of the projection system PS to be applied in order to compensate for the pellicle fingerprint. Because the pellicle distorts in a consistent manner for scanning exposures, the calculations performed by the various models may be performed in advance of the scanning exposure, with the adjustments to be applied to the projection system PS being stored in a memory. The adjustments are then retrieved from the memory and applied to the projection system PS during the scanning exposure. Different adjustments may be calculated for different lengths and speeds of scans, and for different types of pellicle (e.g. pellicles with different thicknesses and tensions).

As has been explained above, the various models used by embodiments of the invention may be generated and/or calibrated outside of the production environment. Their generation and/or calibration therefore does not affect production throughput of the lithographic apparatus. The calibration of the CFD pressure model is performed in the lithographic apparatus which is used for production exposures and thus will have an effect on production throughput. However, the calibration may be performed very rarely. For example, the calibration may be performed once during the initial setup of the lithographic apparatus, e.g. for a variety of different expected exposure scan lengths and speeds. Consequently, the effect on throughput of the lithographic apparatus will be minimal. The calibration may for example take ten to fifteen minutes to perform.

If desired the calibration may be performed periodically, e.g. each month or after several months, in order to take account of any changes of component positions etc., which may take place in the mask assembly environment 18 (although in practice little or no such changes may take place). The calibration may be performed after maintenance of the lithographic apparatus, since the maintenance may affect the positions of components in the mask assembly environment (e.g. within predetermined tolerances).

In an alternative approach to generating the pellicle deformation model, instead of exposing substrates and measuring properties of the exposures, a sensor (not depicted) may be used to measure aberrations caused by the pellicle P. The sensor may for example be a shearing interferometer, and may be used in conjunction with a mask patterned with gratings. The shearing interferometer may comprise diffraction gratings in an image plane of the projection system (e.g. on the substrate table WT) and an imaging sensor located below the diffraction gratings in a pupil plane. This provides an interference pattern that is related to the derivative of the phase of the radiation with respect to a coordinate in the pupil plane in the shearing direction. The imaging detector may comprise an array of sensing elements such as, for example, charge coupled devices (CCDs). The gratings are illuminated using diffuse radiation (e.g. provided from the illumination system IL). In one embodiment the mask assembly MS and the sensor both undergo scanning movement. The sensor is used to measure changes to the phase of the radiation beam caused by the pellicle during the scanning movement. The measured changes of phase may be used to calculate deformation of the pellicle model which occurs during the scanning movement. The pressure sensors 30 are used to measure pressure during the scanning movement. This allows aberrations induced by the pellicle P to be linked to pressure values measured at the pressure sensors 30.

In the embodiment of the invention described above, the lens adjustments which are used to compensate for the pellicle fingerprint are determined in advance and are then applied during exposure of a substrate. This approach is advantageous because attempting to calculate the lens adjustments in real time, based on real-time pressure-measurements received from the pressure sensors, may be difficult to achieve. This is because a large amount of computational power is needed in order to calculate the adjustments, and it may be difficult to calculate the adjustments sufficiently quick to provide correction of the pellicle fingerprint in time. Nevertheless, this is a possibility and could be used for example if a powerful computer were used to perform the calculations and if the pressure sensors 30 were able to provide measurements to the computer sufficiently quickly.

In an embodiment, lens adjustments which are used to compensate for the pellicle fingerprint may be recalculated periodically. This recalculation may for example comprise calibrating the CFD pressure model to take into account measurements obtained by the pressure sensors 30 during production exposures. Outputs from the calibrated CFD pressure model are provided to the pellicle deformation model and flow through to the calculation of lens adjustments. The calibration of the CFD pressure model may be performed periodically. The calibration may for example be performed after exposure of a substrate, after exposure of a lot of substrates, or after exposure of a plurality of lots of substrates.

In an embodiment, lens adjustments which are used to compensate for the pellicle fingerprint may be recalculated during exposure of a substrate. For example, measurements received from the pressure sensors during a scanning exposure of a substrate may be used to calibrated the CFD model, outputs from which may be used to determine adjustments of the lithographic apparatus to be performed during a subsequent scanning exposure of the same substrate (e.g. the next exposed target area, or the next exposed target area after that).

In an embodiment, the CFD pressure model may take into account the history of movement of the pellicle P. For example, the pellicle may be stationary before exposure of a new substrate commences. When exposure of that substrate commences vibrations of the mask assembly MS will occur, and these vibrations will stabilise after around two or three scanning exposures. The effect of these vibrations and the way that they change during the first few scanning exposures may be taken into account by the CFD pressure model.

The adjustments to be applied by the lithographic apparatus during scanning exposures may be stored at the lithographic apparatus. Alternatively, the adjustments may be stored remotely and may be communicated to the lithographic apparatus when they are needed.

The adjustments which compensate for the pellicle fingerprint may be combined with adjustments which compensate for other aberration sources in the lithographic apparatus (e.g. adjustments which compensate for aberrations caused by heating of lenses of the projection system during exposures).

Although the described embodiment of the invention refers to particular forms of models, and suitable forms of models may be used.

Although adjustments which compensate for the pellicle fingerprint have been explained in terms of lens adjustments, the lithographic apparatus may use other adjustments. For example, the position of the substrate during the scanning exposure may be adjusted by the lithographic apparatus (e.g. some movement in the z-direction may be used to compensate for a change of focus).

The pressure sensors 30 may be retro-fitted to a lithographic apparatus which have already been installed in a production environment.

References in this document to the pressure of gas beneath the pellicle should not be interpreted as requiring that the pellicle must have a particular orientation. The term "beneath the pellicle" should be interpreted as meaning on a side of the pellicle which faces towards the projection system of the lithographic apparatus. This may also be referred to as "outside" the pellicle.

The pellicle deformation model provides as an output z-direction movements of the pellicle during a scanning exposure. This output may be used to determine the extent to which the effectiveness of a pellicle is reduced by the z-direction deflection. If a dust particle is present on the pellicle then z-direction deflection towards the mask will move the dust particle closer to the focal plane of the lithographic apparatus. The extent to which this happens can be determined using the pellicle deformation model. The effect of the z-direction deflection of the dust particle can then be determined.

In an embodiment, there is provided a lithographic apparatus comprising: a support structure constructed to support a patterning device and associated pellicle, the patterning device being capable of imparting the radiation beam with a pattern in its cross-section to form a patterned radiation beam; and a projection system configured to project the patterned radiation beam onto a target portion of a substrate, wherein the support structure is located in a housing and wherein pressure sensors are located in the housing.

In an embodiment, the pressure sensors are provided either side of an opening in the housing, the opening being between the pellicle and the projection system. In an embodiment, a plurality of pressure sensors are provided on each side of the opening in a scanning direction of the lithographic apparatus. In an embodiment, a series of pressure sensors is provided. In an embodiment, the series of pressure sensors is arranged as a one dimensional array which extends in the scanning direction. In an embodiment, the lithographic apparatus further comprises a controller configured to apply adjustments to the lenses of the projection system during the scanning exposure to compensate for aberrations due to deformation of the pellicle caused by pressure variations in the environment between the projection system and the pellicle during scanning movement of the mask and pellicle. In an embodiment, the controller uses a pressure model which models pressure variations of gas in the environment between the projection system and the pellicle during the scanning movement of the mask and pellicle, and wherein the pressure model is calibrated for that lithographic apparatus using pressure measurements obtained from the pressure sensors during scanning movement of the mask and pellicle.

In an embodiment, there is provided a sensing system assembly comprising a two-dimensional array of pressure sensors supported by a support structure and further comprising a pellicle frame and a pellicle, wherein the two-dimensional array of pressure sensors is located between the support structure and the pellicle and configured to measure pressure changes caused by movements of the pellicle, wherein the support structure is not a conventional mask, and wherein the sensing system assembly has outer dimensions which correspond with outer dimensions of a mask assembly comprising a conventional mask, pellicle frame and pellicle.

In an embodiment, the sensing system assembly measures around 150 mm by around 150 mm. In an embodiment, the sensing system assembly has a thickness of around 6 mm. In an embodiment, the sensing system assembly further comprises electronics, the electronics including at least one of a memory, a processor and a transmitter.

In an embodiment, there is provided a method of measuring pellicle deflection in a lithographic apparatus, the method comprising: loading a mask assembly comprising a mask and pellicle into a lithographic apparatus as described herein, performing scanning movements of the mask assembly and obtaining pressure measurements using the pressure sensors; and calculating deflections of the mask assembly pellicle that occur during the scanning movements.

In an embodiment, there is provided a method of measuring pellicle deflection in a lithographic apparatus, the method comprising: loading a sensing system assembly as described herein into the lithographic apparatus performing scanning movements of the sensing system assembly and obtaining pressure measurements using the sensing system assembly; and calculating deflections of the sensing system assembly pellicle that occur during the scanning movements.

In an embodiment, deflections of the sensing system assembly pellicle are calculated using acoustic holography. In an embodiment, pressure measurements are stored in a memory in the sensing system assembly. In an embodiment, pressure measurements are transmitted from the sensing system assembly whilst the sensing system assembly is located within the lithographic apparatus.

In an embodiment, there is provided a method of performing a scanning exposure of a target portion of a substrate using a lithographic apparatus, the method comprising: loading a mask assembly comprising a mask and pellicle into the lithographic apparatus; passing a radiation beam through the mask and through the pellicle during scanning movement of the mask and the associated pellicle and during scanning movement of the substrate; using a projection system of the lithographic apparatus to project the radiation beam onto the target portion of the substrate; and applying adjustments to the lenses of the projection system during the scanning exposure to compensate for aberrations due to deformation of the pellicle, the deformation of the pellicle having been measured using a method as described herein.

In an embodiment, there is provided a computer program comprising computer readable instructions configured to cause a computer to carry out a method as described herein.

In an embodiment, there is provided a computer comprising: a memory storing processor readable instructions; and a processor arranged to read and execute instructions stored in said memory, wherein the processor readable instructions comprise instructions arranged to control the computer to carry out a method ad described herein.

Aspects of the invention can be implemented in any convenient way including by way of suitable hardware and/or software. For example, a programmable device, which may form part of the controller CT, may be programmed to implement embodiments of the invention. The invention therefore also provides suitable computer programs for implementing aspects of the invention. Such computer programs can be carried on suitable carrier media including tangible carrier media (e.g. hard disks, CD ROMs and so on) and intangible carrier media such as communications signals.

While specific embodiments of the invention have been described above, it will be appreciated that the invention may be practiced otherwise than as described. The description is not intended to limit the invention.

The invention claimed is:

1. A lithographic apparatus comprising:
a housing having pressure sensors;
a support structure located in the housing, the support structure constructed to support a patterning device and associated pellicle, where the patterning device is capable of imparting the radiation beam with a pattern in its cross-section to form a patterned radiation beam; and
a projection system configured to project the patterned radiation beam onto a target portion of a substrate,
wherein a pressure sensor of the pressure sensors is located either side of an opening in the housing, the opening located between the pellicle and the projection system.

2. The lithographic apparatus of claim 1, wherein a plurality of pressure sensors are provided on each side of the opening in a scanning direction of the lithographic apparatus.

3. The lithographic apparatus of claim 2, wherein a series of pressure sensors is provided.

4. The lithographic apparatus of claim 3, wherein the series of pressure sensors is arranged as a one dimensional array which extends in the scanning direction.

5. The lithographic apparatus of claim 1, further comprising a controller configured to apply adjustments to the lenses of the projection system to compensate for aberrations due to deformation of the pellicle caused by pressure variations in the environment between the projection system and the pellicle during scanning movement of the patterning device and pellicle.

6. The lithographic apparatus of claim 5, wherein the controller is configured to use a pressure model arranged to model pressure variations of gas in the environment between the projection system and the pellicle during the scanning movement of the patterning device and pellicle, and wherein the pressure model is calibrated for that lithographic apparatus using pressure measurements obtained from the pressure sensors during scanning movement of the patterning device and pellicle.

7. A method of measuring pellicle deflection in a lithographic apparatus, the method comprising:
loading a patterning device assembly comprising a patterning device and pellicle into the lithographic apparatus of claim 1;
performing scanning movements of the patterning device assembly and obtaining pressure measurements using the pressure sensors; and
calculating deflections of the patterning device assembly pellicle that occur during the scanning movements.

8. A method of performing a scanning exposure of a target portion of a substrate using a lithographic apparatus, the method comprising:
loading a mask assembly comprising a mask and pellicle into the lithographic apparatus;
passing a radiation beam through the mask and through the pellicle during scanning movement of the mask and the associated pellicle and during scanning movement of the substrate;
using a projection system of the lithographic apparatus to project the radiation beam onto the target portion of the substrate; and
applying adjustments to the lenses of the projection system to compensate for aberrations due to deformation of the pellicle, the deformation of the pellicle having been measured using the method according to claim 7.

9. A non-transitory computer program product comprising computer readable instructions therein, that when executed, are configured to cause a computer system to at least:
obtain pressure measurements from pressure sensors during scanning movement of a patterning device assembly comprising a patterning device and pellicle, in a lithographic apparatus, the lithographic apparatus comprising:
a housing having the pressure sensors,
a support structure located in the housing, the support structure constructed to support the patterning device assembly, and
a projection system configured to project a radiation beam patterned by the patterning device onto a target portion of a substrate,
wherein a pressure sensor of the pressure sensors is located either side of an opening in the housing, the opening located between the pellicle and the projection system; and
calculate deflections of the patterning device assembly pellicle that occur during the scanning movements.

10. The computer program product of claim 9, wherein the instructions are further configured to cause the computer system to determine adjustments to lenses of the projection system to compensate for aberrations due to deformation of the pellicle caused by pressure variations in the environment between the projection system and the pellicle during scanning movement of the patterning device and pellicle.

11. The computer program product of claim 9, wherein the instructions are further configured to cause the computer system to use a pressure model arranged to model pressure variations of gas in the environment between the projection system and the pellicle during the scanning movement of the patterning device and pellicle, wherein the pressure model is calibrated for that lithographic apparatus using pressure measurements obtained from the pressure sensors during scanning movement of the patterning device and pellicle.

* * * * *